United States Patent [19]

Howell et al.

[11] Patent Number: 4,567,603
[45] Date of Patent: Jan. 28, 1986

[54] FSK MODULATOR AND METHOD FOR NRZ DATA TRANSMISSION UTILIZING PLL FREQUENCY SYNTHESIS

[75] Inventors: William J. Howell, Tempe; John D. Hatchett, Scottsdale, both of Ariz.

[73] Assignee: Motorola, Inc., Schaumburg, Ill.

[21] Appl. No.: 502,778

[22] Filed: Jun. 9, 1983

[51] Int. Cl.[4] .............................................. H03C 3/06
[52] U.S. Cl. .......................................... 375/65; 332/19
[58] Field of Search .................................. 375/62–66; 340/825.58; 455/618; 332/16 R, 19, 21

[56] References Cited

U.S. PATENT DOCUMENTS

| | | | |
|---|---|---|---|
| 3,938,045 | 2/1976 | Mathwich | 375/64 |
| 4,052,672 | 10/1977 | Enderby et al. | 332/16 R |
| 4,068,198 | 1/1978 | Otto | 375/64 |
| 4,068,199 | 1/1978 | Madoff | 375/65 |
| 4,286,237 | 8/1981 | James | 332/16 R |
| 4,447,792 | 5/1984 | Wynn | 332/19 |
| 4,481,489 | 11/1984 | Kurby | 332/19 |

Primary Examiner—Robert L. Griffin
Assistant Examiner—Stephen Chin
Attorney, Agent, or Firm—William J. Kubida; Dale E. Jepsen

[57] ABSTRACT

A frequency generator in which the PLL frequency synthesizer and the VCO are directly modulated by an input serial data stream for providing an FSK modulated RF output signal useful in narrowband data communication systems. The serial data stream may alternatively modulate either the PLL frequency synthesizer or the VCO alone.

10 Claims, 3 Drawing Figures

U.S. Patent  Jan. 28, 1986  4,567,603
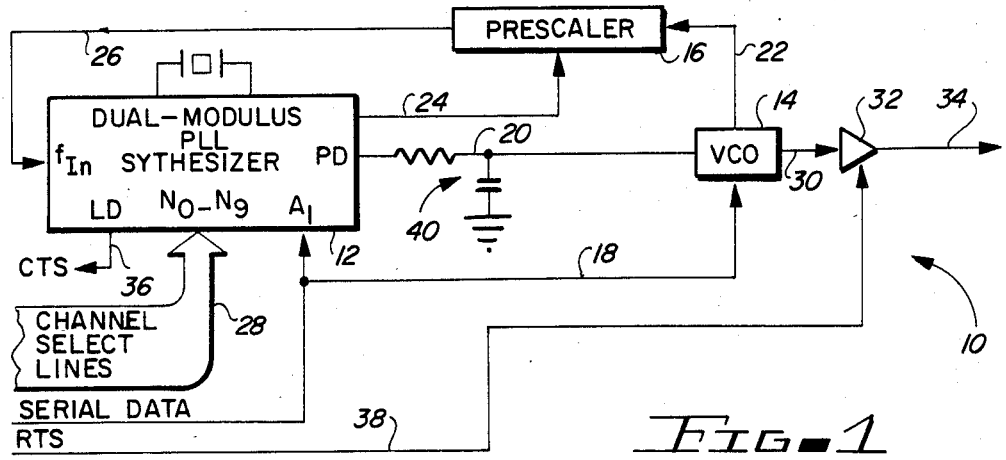
FIG-1
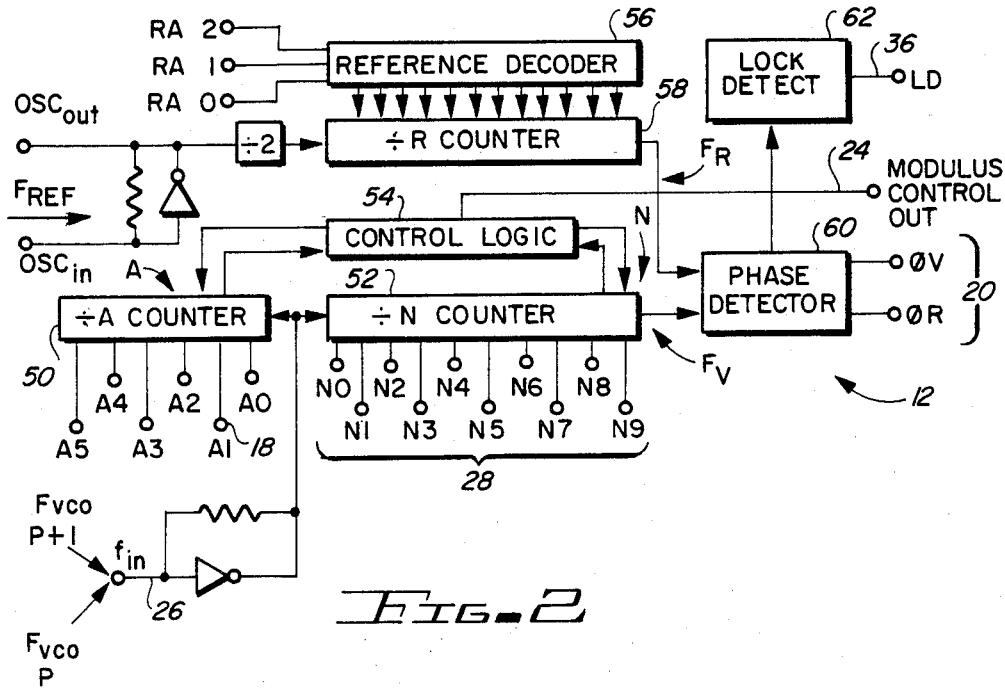
FIG-2
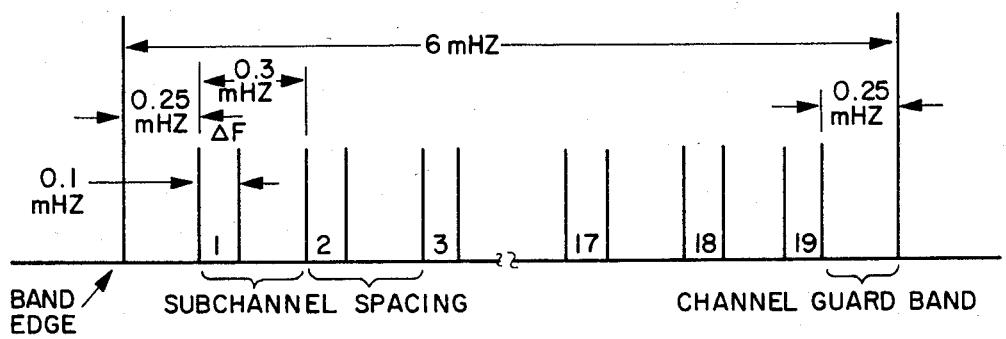
FIG-3  SUBCHANNEL SPACING FOR ANY 6 mHZ BAND

FSK MODULATOR AND METHOD FOR NRZ DATA TRANSMISSION UTILIZING PLL FREQUENCY SYNTHESIS

BACKGROUND OF THE INVENTION

The present invention relates, in general, to the field of broadband radio frequency (RF) modems and methods for intertransmission of data on a local network thereof. More particularly, the present invention relates to a frequency agile, phase continuous, frequency shift keyed (FSK) modulator and method for non-return to zero (NRZ) and other data utilizing dual modulus phase locked loop (PLL) frequency synthesis. A common use for such a modulator is in broadband RF modems as well as other communications equipment.

In the past, PLL's have been utilized as a frequency synthesizer for the transmit and receive functions of RF modems and other transceivers. PLL synthesizers are utilized to contol an oscillator, usually a VCO, by means of a digitally coded input to the PLL synthesizer for generation of an error signal to the oscillator. Generally, FSK modulation is used as opposed to amplitude (AM) or phase (PM) modulation techniques.

Certain prior art circuits generate FSK data by employing two oscillators, each generating an output at a different frequency, and providing means for switching back and forth between the oscillators in response to whether the digital serial data input signal is low or high. Such prior art circuits suffer from several limitations including the fact that in order to change the output frequencies, i.e., to switch between different sub-channels, multiple pairs of oscillators must be used. Additionally, these prior art circuits generate undesirable AM sidebands as the oscillators are switched on and off.

An alternative concept is disclosed in U.S. Pat. No. 3,902,013 issuing to Charbonnier on Aug. 26, 1975 for a "Frequency Synthesis Control for a Frequency-Modulated Telegraphic Transmitter". This patent presents an extremely complex system and fails to show any direct modulation of a VCO with the NRZ data stream, instead requiring a coding matrix responsive to the data input. Additionally, this patent fails to show any mechanism for switching between channels in a broadband RF system and contemplates use of a programmable counter/divider.

An additional concept is described in U.S. Pat. No. 3,993,868 issuing to Balcewicz on Nov. 23, 1976 for a "Minimum Shift Keying Communications System". This patent describes a communications system utilizing a pair of PLL's, each generating a different frequency. The device switches between these PLL's to transmit a "minimum shift keying" FSK encoded signal. As above described with respect to the U.S. Pat. No. 3,902,013, there is neither a disclosure of any direct modulation of the VCO by a serial data input stream nor is any mechanism disclosed for switching between channels.

Other patents illustrative of prior art techniques include U.S. Pat. No. 3,787,775 issuing to Lanning on Jan. 22, 1974 for a "Phase Correction Circuit" and describing a demodulator for phase shift keying; U.S. Pat. No. 3,860,874 issuing to Malone et al. on Jan. 14, 1975 for a "Receiver for DFSK Signals" showing a demodulator for double FSK data; and U.S. Pat. No. 4,335,446 issuing to Gandini et al. on June 15, 1982 for "Terminal Equipment for Data-Transmission Network Including Digitally Operating Modem" illustrative of the technique of differential phase shift keying.

SUMMARY OF THE INVENTION

It is therefore an object of the present invention to provide an improved FSK modulator and method for NRZ data transmission utlizing PLL frequency synthesis.

It is further an object of the present invention to provide an improved FSK modulator and method for NRZ data transmission utilizing PLL frequency synthesis which is readily and inexpensively implemented utilizing existing components.

It is still further an object of the present invention to provide an improved FSK modulator and method for NRZ data transmission utilizing PLL frequency synthesis suitable for use in narrowband data communication systems.

It is still further an object of the present invention to provide an improved FSK modulator and method for NRZ data transmission utilizing PLL frequency synthesis which allows for multiple FSK modulation frequencies by FSK modulating a PLL synthesizer or VCO.

The foregoing and other objects are achieved in the present invention wherein there is provided an improved frequency generator and method for providing an FSK modulated RF signal which comprises a PLL frequency synthesizer having a frequency input thereto and phase detector output thereof. A VCO having error signal and modulation inputs thereto has its error signal input connected to the phase detector output of the PLL frequency synthesizer and an output therefor coupled to the frequency input of the PLL frequency synthesizer. Means are also provided for applying a serial data stream to the modulation input of the VCO or a divide input to the PLL frequency synthesizer. The serial data stream may also be applied directly to both the modulation input of the VCO and the divide input of the PLL frequency synthesizer.

Alternative embodiments may include a prescaler coupling the VCO output to the frequency input of the PLL frequency synthesizer. In other embodiments, the prescaler may be a dual modulus prescaler responsive to a modulus control output of the PLL frequency synthesizer.

BRIEF DESCRIPTION OF THE DRAWINGS

The above mentioned and other features and objects of the invention and the manner of attaining them will become more apparent and the invention itself will be best understood by reference to the following description of an embodiment of the invention taken in conjunction with the accompanying drawings, wherein:

FIG. 1 is a simplified logic flow diagram of an FSK modulator in accordance with the present invention illustrating the modulation of both the PLL frequency synthesizer and the VCO by a serial data stream and utilizing dual modulus prescaling techniques;

FIG. 2 is a simplified logic flow diagram of the PLL frequency synthesizer of FIG. 1 useful in understanding the operation thereof; and FIG. 3 is a graphic representation of the sub-channel spacing between adjacent channels which may be achieved by use of the present invention.

DESCRIPTION OF A PREFERRED EMBODIMENT

With reference to FIG. 1, an FSK modulator 10 in accordance with the present invention is shown. FSK modulator 10 would serve as a frequency generator in the transmitter portion of a broadband RF modem or other communications equipment. FSK modulator 10 comprises, in pertinent part, a PLL frequency synthesizer 12 connected in a phase locked loop configuration with VCO 14 and dual modulus prescaler 16. PLL frequency synthesizer 12 will be more fully described hereinafter.

In operation, an error signal is applied from PLL frequency synthesizer 12 to an error signal input of VCO 14. This error signal appears on $PD_{OUT}$ line 20 and may be filtered by means of a loop filter 40, which in the embodiment shown, may comprise a discrete RC low pass filter. An output signal from VCO 14 is then applied to prescaler input line 22 for input to dual modulus prescaler 16. The output of dual modulus prescaler 16 appearing on frequency input line 26 is then applied to the frequency input of PLL frequency synthesizer 12. The divisor, or modulus, of dual modulus prescaler 16 is controlled by means of a signal from PLL frequency synthesizer 12 appearing on modulus control line 24.

The operating frequency of FSK modulator 10 is established by means of a digitally coded parallel input to PLL frequency synthesizer 12 appearing on channel select lines 28. PLL frequency synthesizer 12 has an additional control output appearing on clear to send (CTS) line 36. A serial data signal such as non-return to zero (NRZ) data is applied to the $A_1$ input of PLL frequency synthesizer 12 as well as a modulation input of VCO 14 by means of serial data line 18. Although shown as connected to both a divide input to PLL frequency synthesizer 12 and a modulation input to VCO 14, serial data 18 may be connected to only the $A_1$ divide input of PLL frequency synthesizer 12. In this instance, FSK modulator 10 will operate suitably only for extremely low data rates. If serial data line 18 is applied only to the modulation input of VCO 14, high data rates may be handled by FSK modulator 10 provided a low frequency restriction is placed on the data rate and the duty cycle is near 50%. When a serial data stream is applied to serial data line 18 connected, as shown, to the $A_1$ divide input of PLL frequency synthesizer 12 as well as the modulation input of VCO 14, both high and low data rates may be handled with no low frequency restrictions, thus, establishing a system suitable for modulating a carrier with NRZ data. In this instance, since both the $A_1$ divide input and VCO 14 modulation input are shifted together, the shift in frequency at the devices is the same, and hence, there is no change in the error signal appearing on $PD_{OUT}$ line 20. The FSK output from VCO 14 appears on VCO output line 30 for input to a gate 32. Request to send (RTS) line 38 allows the signal appearing on VCO output line 30 to be gated to FSK output line 34. Although illustrated as separate outputs of VCO 14, prescaler input line 22 and VCO output line 30 may be electrically common.

Referring additionally now to FIG. 2, a generalized logic flow diagram of PLL frequency synthesizer 12 is shown. Input to PLL frequency synthesizer 12 is made via frequency input line 26 to divide by A counter 50 and divide by N counter 52. The signal appearing on frequency input line 26 is derived from dual modulus prescaler 16. The reference frequency ($F_{REF}$) applied to PLL frequency synthesizer 12 is established by means of a crystal oscillator, the output of which is divided appropriately by R counter 58 as determined by the state of three inputs to reference decoder 56. Phase detector 60 provides phase detector outputs $\phi_V$ and $\phi_R$ which may be combined externally for use as a loop error signal. If frequency $F_V$ is greater than $F_R$ or if the phase of $F_V$ is leading, then error information is provided by $\phi_V$ pulsing low while $\phi_R$ remains essentially high. If the frequency of $F_V$ is less than $F_R$ or if the phase of $F_V$ is lagging, then error information is provided by $\phi_R$ pulsing low while $\phi_V$ remains essentially high. If the frequency of $F_V$ equals $F_R$ and both are in phase, then both $\phi_V$ and $\phi_R$ remain high except for a small minimum time period when both pulse low in phase.

A signal is generated by control logic circuit 54 of PLL frequency synthesizer 12 for controlling an external dual modulus prescaler 16. The modulus control level will be low at the beginning of a count cycle and will remain low until divide by A counter 50 has counted down from its programmed value. At this time, modulus control line 24 goes high and remains high until divide by N counter 52 has counted the rest of the way down from its programmed value (N−A additional counts since both divide by N counter 52 and divide by A counter 50 are counting down during the first portion of the cycle). The signal on modulus control line 24 is then set back low, and both divide by A counter 50 and divide by N counter 52 are preset to their respective programmed values, and the above sequence is repeated. The foregoing provides for a total programmable divide value $(N_T) = N \cdot P + A$ where P and (P+1) are used to represent the divide values of dual modulus prescaler 16 respectively for high and low modulus control levels on modulus control line 24; N is the number programmed into divide by N counter 52 and A is the number programmed into divide by A counter 50.

The inputs $N_0$–$N_9$ to divide by N counter 52 appearing on channel select lines 28 provide the data that is preset into divide by N counter 52 when it reaches the count of zero. $N_0$ is the least significant digit and $N_9$ is the most significant. The $A_0$–$A_5$ inputs to divide by A counter 50 define the number of clock cycles of the signal appearing on frequency input line 26 that require a logic 0 on modulus control line 24. As shown, serial data line 18 is connected to the $A_1$ input to divide by A counter 50.

The output of lock detect circuit 62 is a lock detector signal applied to CTS line 36. A high logic level appears on CTS line 36 when the loop is locked, that is, $F_R$ and $F_V$ are of the same phase and frequency. CTS line 36 pulses low when the loop is out of lock.

THEORY OF OPERATION

In the ensuing description the following definitions are used:
$N_T$ = total system divide value
N = count in ÷ N counter
A = count in ÷ A counter
P/P+1 = divide values of prescaler
$F_{REF}$ = frequency of PLL crystal
$F_R$ = PLL reference frequency to phase comparator
$F_V$ = feedback frequency to phase comparator (as divided down)
ΔF = frequency deviation between FSK frequencies
$F_{VCO}$ = VCO frequency Referring additionally now to FIG. 3, the sub-channel spacing for a broadband RF modem utilizing an FSK modulator 10 in accordance with the present invention is shown. In this illustration, a 0.3 MHZ sub-channel spacing is utilized. In accordance with the present invention, it should be noted that when serial data line 18 is connected to the $A_1$ divide input of PLL frequency synthesizer 12, $\Delta F = 2 \times$ (bit rate). If connected to the $A_0$ divide input, $\Delta F =$ (bit rate). In general, a requirement for non-return to zero (NRZ) data is:

$F_R$ = (bit rate) times a whole number

Generally speaking, when conservation of RF bandwidth is critical, $F_R$ should be one or two times the bit rate to allow NRZ data transmission.

One requirement for an FSK modulator 10 in accordance with the present invention is that $F_R$ equal the bit rate (or some whole number times the bit rate) to assure that the average divide by N value into the combination of divide by N counter 52 and divide by A counter 50 represents the average frequency out of VCO 14. Additionally, for a desired channel spacing, 2.5 or 3 times $\Delta F$, where $\Delta F$ is two times the bit rate in frequency, $F_R$ then equals the bit rate (or two times the bit rate). Utilizing a dual modulus prescaler 16 having divide by 5/6 values allows for 2.5 times $\Delta F$ deviation for channel spacing. This is sometimes considered a necessary minimum for reliable adjacent channel operation between sub-channels. Utilizing a dual modulus prescaler 16 having divide by 6/7 or ¾ values allows a sub-channel spacing equal to 3 times $\Delta F$. In general:

$(\Delta N) \cdot P$ = (the channel spacing in frequency) divided by $F_R$ where $\Delta N$ is the change in count programmed into divide by N counter 52 and where $N_T = N(P) + A$.

Channel spacing is important in a broadband RF modem such that it may operate with adjacent channels present without interference and not waste available RF bandwidth. Utilizing a sub-channel spacing of $2\Delta F$ may not allow for reliable adjacent channel operation because of overlap of the first sidebands of the respective carrier frequencies of the sub-channels. Further, a sub-channel of spacing $4\Delta F$ wastes bandwidth between adjacent sub-channels.

With this in mind, digital PLL approaches can be employed to implement FSK transmitters in broadband RF modems and other communications equipment with a savings in cost and needed components external to the PLL frequency synthesizer 12 as compared to prior art analog approaches. However, to accomplish this, methods must be established that will program PLL frequency synthesizer 12 by changing only one bit, or one line, to the programmable counters of PLL frequency synthesizer 12 when implementing the oscillators required frequency shift corresponding to a logic "1" or "0" in the data stream. Utilizing more than one programming line to accomplish the required frequency shift would overly complicate the programming interface. Moreover, if different program lines (or line) are required when operating on different channel frequencies, further complications are encountered. In accordance with one embodiment of the present invention, dual modulus prescaling techniques are utilized.

To meet the requirements of an FSK system, i.e. phase detector comparison frequency, "1", "0", VCO 14 frequency values, VCO 14 channel frequency values etc. specific dual modulus prescaler 16 values (P/P+1) are required when directly generating the RF carriers.

In a system as above described, it can be seen that:

$F_{VCO} = N_T \times F_R = N_T \Delta F / 2$ and $N_T = N(P) + A$

Thus, to implement a frequency shift of $\Delta F$ requires that $N_T$ be altered by a value of 2. This can be accomplished by one program line to divided by A counter 50 to cause the counter divide value to be changed by 2. That is, the $2^1$ or bit 1 line to divide by A counter 50. To accomplish the desired channel change, however, requires $N_T$ to be altered by six to correspond to $F_{VCO}$ changing $6\Delta F/2$ equals $3\Delta F$. To do this and still maintain the same method of getting $\Delta F$ for the new operating channel as noted above, dictates that P equals 6, i.e. the P/P+1 divide values of dual modulus prescaler 16 be divide by 6/7. Such prescaler i.c.'s are not as readily available as a divide by 5/6 unit. Thus, it may be desirable that a way be found to meet the above system requirements while utilizing the more commonly available divide by 5/6 units for dual modulus prescaler 16.

By inverting the phase of the signal on modulus control line 24, before its application to dual modulus prescaler 16, a new relationship may be derived using the term (P+1) rather than P. In this manner, the appropriate $N_T$ relationship can be attained utilizing a system operating as follows.

As already described, dual modulus prescaler 16 divides by (P+1) when the signal on modulus control line 24 is a logic low, and by P when a logic high is provided. At the beginning of a count sequence, an inverted modulus control signal on modulus control line 24 may be provided which is high, thus giving a divide by P, and which remains high until divide by A counter 50 counts a number "A" input edges supplied by the output of dual modulus prescaler 16. This gives a value of $(P \times A)$ VCO 14 cycles. Additionally, during this time the value "N" in divide by N counter 52 will be decremented by a number A counts leaving (N−A) as the value remaining in divide by N counter 52.

After divide by A counter 50 counts down, the inverted signal on modulus control line 24 is caused to go low, thus giving a divide by P+1, until divide by N counter 52 finishes counting down. That is, for (N−A) (P+1) more cycles of VCO 14. Once counted down, divide by N counter 52 provides an output to phase detector 60.

From the above, it can be seen that $$N_T = P \times A + (N - A)(P + 1)$$
$$= PA + NP + N - AP - A$$
$$= NP + N - A.$$

Therefore:

$N_T = N(P+1) - A$

It can be seen, therefore, that using this method, a divide by 5/6 prescaler may be utilized rather than a divide by 6/7 to meet the FSK system requirements for FSK modulator 10 above described. It should be noted, that the delay time for the added inverter (not shown in FIG. 1) on dual modulus control line 24 should be maintained as low as possible since it effects the maximum frequency of VCO 14 that can be expected in accordance with the following constraints:

$F_{VCOmax}/P$ equals the signal frequency maximum out of dual modulus prescaler 16 and into divide by A counter 50 and divide by N counter 52.

$P/F_{VCOmax}$ equals the minimum time for one period of signal out of dual modulus prescaler 16. Therefore, $$P/F_{VCOmax} > t_P + (t_{SU} \text{ or } t_R) + t_D + t_I$$

where:

$t_p$ equals the propagation time from input to output of dual modulus prescaler 16.

$t_{SU}$ equals the setup time of dual modulus prescaler 16 relative to its modulus control signal on modulus control line 24 or the modulus control inverter's output when such an inverter is inserted in modulus control line 24.

$t_R$ equals the release time of dual modulus prescaler 16 relative to its modulus control signal on modulus control line 24 or the modulus control inverter's output when such an inverter is inserted in modulus control line 24.

$t_D$ equals the delay time between completion of a divide by P or divide by P+1 count sequence, indicated by an input signal edge to divide by A counter 50 and divide by N counter 52, and the time that the modulus control signal level is changed into the additional modulus control signal line 24 inverter.

$t_I$ equals the propagation time between input and output of the modulus control inverter added to modulus control line 24.

The above constraints also apply when no inverter is added in modulus control line 24, i.e., when $N_T = NP + A$ where $t_I = 0$.

In the above described embodiment, PLL frequency synthesizer 12 may be furnished as a Motorola MC145146, MC145152, MC145156, MC145158 or other similar PLL frequency synthesizers available from Motorola, Inc. assignee of the present invention. Further, dual modulus prescaler 16 may be a MC12009, MC12011, MC12013 or similar unit also available from Motorola, Inc.

What has been provided therefore is an improved FSK modulator and method for NRZ data transmission utilizing PLL frequency synthesis which is readily and inexpensively implemented utilizing existing components.

Moreover, the FSK modulator and method of the present invention is suitable for use in narrowband data communications systems and allows for multiple FSK modulation frequencies by directly FSK modulating a PLL synthesizer and VCO.

While there have been described above the principles of this invention in conjunction with specific apparatus, it is to be clearly understood that this description is made only by way of example and not as a limitation to the scope of the invention. For example, it should be noted that similar but more limited approaches in accordance with the present invention may be achieved by either replacing dual modulus prescaler 16 with a single divide value prescaler or omitting the prescaler function completely and connecting an output signal from VCO 14 to frequency input line 26 of PLL frequency synthesizer 12.

I claim:

1. A frequency generator for providing an FSK modulated RF signal comprising:
   a PLL frequency synthesizer having frequency and divide inputs thereto and a phase detector output thereof;
   a VCO having error and modulation inputs thereto, said error input being connected to said phase detector output of said PLL frequency synthesizer and an output thereof being coupled to said frequency input of said PLL frequency synthesizer; and
   means connected to said PLL frequency synthesizer for directly applying a serial data stream to said divide input of said PLL frequency synthesizer and said modulation input of said VCO whereby said FSK modulated RF signal is provided at said output of said VCO in response to said serial data stream.

2. The frequency generator of claim 1 wherein said PLL frequency generator further comprises a channel select input and means for generating a channel select signal for application to said channel select input of said PLL frequency synthesizer.

3. The frequency generator of claim 1 further comprisng a loop filter interconnecting said phase detector output of said PLL frequency synthesizer to said error signal input of said VCO.

4. The frequency generator of claim 1 further comprising a prescaler coupling said VCO output to said frequency input of said PLL frequency synthesizer.

5. The frequency generator of claim 4 wherein said prescaler is a dual modulus prescaler having a modulus control input thereto coupled to a modulus control output of said PLL frequency synthesizer.

6. A method for providing an FSK modulated RF signal comprising the steps of:
   providing a PLL frequency synthesizer having frequency and divide inputs thereto and a phase detector output thereof;
   connecting a VCO at an error signal input thereto to said phase detector output of said PLL frequency synthesizer and at an output thereof to said frequency input of said PLL frequency synthesizer, said VCO further having a modulation input thereto; and
   directly applying a serial data stream to said divide input by said PLL frequency synthesizer and said modulation input of said VCO whereby said FSK modulated RF signal is provided at said output of said VCO in response to said serial data stream.

7. The method of claim 6 further comprising the step of:
   generating a channel select signal for application to a channel select input of said PLL frequency synthesizer.

8. The method of claim 6 further comprising the step of:
   interconnecting said phase detector output of said PLL frequency synthesizer to said error signal input of said VCO through a loop filter.

9. The method of claim 6 further comprising the step of:
   coupling said VCO output to said frequency input of said PLL frequency synthesizer through a prescaler.

10. The method of claim 9 wherein said step of coupling is carried out by means of a dual modulus prescaler responsive to a modulus control output of said PLL frequency synthesizer.

* * * * *